US007533629B2

(12) United States Patent

DeVries et al.

(10) Patent No.: US 7,533,629 B2
(45) Date of Patent: May 19, 2009

(54) ARRANGEMENT, METHOD AND ELECTRODE FOR GENERATING A PLASMA

(75) Inventors: Hindrik Willem DeVries, Tilburg (NL); Jan Bastiaan Bouwstra, Bilthoven (NL); Eugen Aldea, Eindhoven (NL); Mauritius Cornelius Maria Van De Sanden, Tilburg (NL)

(73) Assignee: Fuji Photo Film B.V., Tilburg (NL)

( * ) Notice: Subject to any disclaimer, the term of this patent is extended or adjusted under 35 U.S.C. 154(b) by 14 days.

(21) Appl. No.: 10/917,515

(22) Filed: Aug. 13, 2004

(65) Prior Publication Data

US 2006/0022606 A1 Feb. 2, 2006

(30) Foreign Application Priority Data

Aug. 14, 2003 (EP) .................................. 03077575

(51) Int. Cl.
*C23C 16/00* (2006.01)
*H01L 21/00* (2006.01)

(52) U.S. Cl. .............................. 118/723 E; 156/345.47

(58) Field of Classification Search .............. 118/723 E; 156/345.43, 345.44, 345.45, 345.46, 345.47
See application file for complete search history.

(56) References Cited

U.S. PATENT DOCUMENTS 4,885,074 A * 12/1989 Susko et al. ........... 204/298.35
5,938,854 A * 8/1999 Roth ............................ 134/1
6,528,947 B1 * 3/2003 Chen et al. ............. 315/111.21
6,779,482 B2 * 8/2004 Sakai et al. .............. 118/723 E
2002/0063537 A1 5/2002 Nam et al.

FOREIGN PATENT DOCUMENTS

EP 0467639 A2 1/1992
EP 0467639 A2 1/2002
JP 60039955 2/1985

(Continued)

OTHER PUBLICATIONS

European Office Action cited in corresponding European Patent Application No. 03 077 575.3-2208, mailed May 13, 2005.

(Continued)

*Primary Examiner*—Parviz Hassanzadeh
*Assistant Examiner*—Michelle Crowell
(74) *Attorney, Agent, or Firm*—Davidson Berquist Jackson & Gowdey LLP

(57) ABSTRACT

The present invention provides an arrangement and method for generating a uniform and stable plasma. The arrangement comprises a discharge space (7) between at least a pair of electrodes (1, 2), which electrodes (1, 2) are arranged for providing an electric field and for generating a plasma in the electric field. At least one of the electrodes (1) has a boundary surface (6) with the discharge space (7). The boundary surface is comprised of one or more alternately arranged conductive (4) and insulating regions (5). The invention further relates to an electrode (1) for use in the arrangement described. The invention may, for example, be used in dielectric barrier discharge configurations, or in arrangements for generating plasmas at atmospheric pressures, or for generating plasmas at low temperatures, such as generating atmospheric pressure glow plasmas (APG) for material processing or surface (3) treatment purposes.

23 Claims, 4 Drawing Sheets

FOREIGN PATENT DOCUMENTS

| | | | |
|---|---|---|---|
| JP | 61199078 | A | 9/1986 |
| JP | 06088962 | | 4/1994 |
| JP | 07296993 | A | 11/1995 |
| WO | WO-00/16367 | A1 | 3/2000 |
| WO | WO0016367 | | 3/2000 |
| WO | WO03/019624 | | 3/2003 |
| WO | WO-03/019624 | A2 | 3/2003 |

OTHER PUBLICATIONS

European Search Report cited in corresponding European Patent Application No. 03 077 575.3-2208, mailed Jan. 27, 2004.

U.S. Appl. No. 09/854,655, filed May 12, 2001, Kee-Seok.

European Search Report (EP 03 07 7575) Issued Jan. 27, 2004.

* cited by examiner

ARRANGEMENT, METHOD AND ELECTRODE FOR GENERATING A PLASMA

This application claims priority to Europe Patent Application No. EP 03077575.3, filed Aug. 14, 2003, which is incorporated by reference herein.

FIELD OF THE INVENTION

The present invention relates generally to plasma generation and plasma treatment and, more particularly, to a method and an arrangement for generating a plasma in a discharge space between at least a pair of electrodes arranged for providing an electric field and for generating a plasma in the electric field, at least one of the electrodes having a boundary surface with the discharge space.

The invention further relates to an electrode for use in such an arrangement.

BACKGROUND OF THE INVENTION

The use of plasmas in material processing and/or surface treatment is widespread in industry. Plasmas may be used for all kinds of surface treatments, amongst which are cleaning and activation of surfaces, deposition such as plasma enhanced chemical vapour deposition (PECVD), etc. Plasmas are also used for improving the adhesive properties of a surface, for instance polymer surfaces. An example of this is the photo film production industry, in which plasmas are used to treat the surface of a film substrate, for instance in order to improve adhesive properties.

Plasmas are generally considered as a suitable solution for material processing, because a large flux of reactive species (radicals, ions) is generated, which may be directed to the processing zone and may be processed into the desired shape by using an appropriate electric field distribution.

It will be understood that, especially in applications directed to surface treatment, the plasma may ideally be a uniform and stable plasma. By using a uniform and stable plasma, the surface will be treated in a uniform manner as well. If for instance the adhesive properties are to be enhanced, the person skilled in the art may desire to obtain adhesive properties that are uniform across the treated surface.

In order to achieve the generation of a uniform plasma, firstly it is most important that breakdown of the plasma is uniform, and secondly that the uniformly generated plasma must be maintained as long as possible. In both of these steps major instabilities like streamer breakdown and filamentation may occur. To generate a homogeneous glow, these instabilities should be avoided.

Many efforts have been put in generating plasmas under atmospheric pressure and at low temperatures (e.g. 300 K-400 K), since this greatly enhances the number of applications while it reduces the costs of processing. Advantages of using atmospheric pressure are a larger density of reactive species than in the low pressure case, and the advantage of avoiding vacuum technology. Generation at low temperatures will make the technology applicable to the treatment of thermoplastic polymer surfaces. Another asset would be the ability to generate stable plasmas using air instead of other gasses, since air is cheap and readily available.

Generating a plasma under the above circumstances is not a straightforward technique. At atmospheric pressure, the particle density is high and as a result thereof the mean free path of reactive species is small. The processes of excitation and ionisation are restricted to a limited area, and the plasma is generated primarily in a filamentary form.

Plasmas at atmospheric pressures tend to be very unstable and will tend to develop into a spark or an arc in short time after the breakdown. Any random local increase in a current density will tend to grow rather than to be damped and the plasma will be constricted.

The effects of above-mentioned instabilities may be reduced by limiting the current density and the plasma duration by covering the electrodes with a dielectric (dielectric barrier discharge configuration, DBD). Due to charge accumulation on the surface of the dielectric, the value of the voltage applied to the plasma is reduced. When the magnitude of the voltage applied to the plasma decreases below a critical level (the cut-off voltage), the plasma can not be sustained any longer. The plasma duration will therefore be limited.

On the other hand, however, the use of "strangled" atmospheric plasmas for material processing is less efficient. Additionally, the dielectric barrier discharge may only limit the current density to a certain extent, since streamers having current densities in the range of 10 A/cm$^2$ may still be generated on small surface areas. The dielectric barrier limits the overall current density across the surface of the electrodes used for generating the plasma, but does not prevent strong local currents due to streamer formation to occur.

It is known that the surface of the electrodes (whether or not covered by a dielectric) plays an important role in generating and maintaining the plasma. A variety of interactions between the surface, the electric field for generating the plasma and the plasma itself determine the conditions that are present in a discharge space, and therefore determine whether a generated plasma is stable and uniform or not stable and filamentary.

One of these interactions is based on generating secondary electrons at the surface of the electrode. These secondary electrons must be freed from the surface and be released in the discharge space where they may contribute to the generation of the plasma. Finding a material for which on the one hand sufficient secondary electrons are present near the surface while on the other hand these secondary electrons may be released using only limited amounts of energy is difficult. A number of materials have been proposed, often in combination with dielectric barrier discharge configuration, but finding the optimum in this balance remains a problem in the industry.

SUMMARY OF THE INVENTION

It is an object of the present invention to provide an arrangement and method for generating a plasma by which the abovementioned problems are obviated.

It is a further object of the present invention to provide an arrangement and method which are capable of generating a plasma which is uniform and stable.

In a first aspect of the invention, these and other objects are achieved by the present invention, by providing an arrangement for generating a plasma, comprising a discharge space between at least a pair of electrodes arranged for providing an electric field and for generating a plasma in the electric field, at least one of the electrodes having a boundary surface with the discharge space, wherein the boundary surface is comprised of one or more alternately arranged electrically conductive and insulating regions.

It is especially the combination of using electrically conductive regions, for which the work function is low, and insulating regions, on which charge is accumulated, that provides benefits. The work function of the surface is indicative of the energy required for releasing electrons from the surface. Conductive surfaces provide a low work function and electrons, present near the surface of a conductor, may be easily released, for instance under the influence of an electric field.

On the other hand, an insulating surface in an electric field is characterized by charge accumulation on the surface, which accumulation of charge locally intensifies the electric field near the surface.

It may therefor be understood that a surface which is comprised of regions which locally intensify the electric field and regions having a low work function, where electrons may easily be released under the influence of an electric field, is very efficient in providing electrons to the discharge space. Using such a surface on the electrodes of the arrangement as mentioned above is therefor beneficial, since the electrons that are efficiently released through the surface may contribute to the plasma.

In an embodiment of the present invention, the electrically conductive regions and the insulating regions are uniformly distributed across the boundary surface.

A uniform distribution of electrically conductive regions and insulating regions enables the release of electrons from that surface to be more homogeneous across the surface as a whole. This contributes to the uniformity of the plasma since it enables uniform plasma generation. In addition, once the plasma is generated, due to a more homogeneous release of electrons across the surface, the distribution of electrons across the discharge space will be more uniform as well and this contributes to the stability of the plasma.

According to another embodiment of the present invention, the surface area of either one or more of the conductive regions and the insulating regions, is at least an order of magnitude less than the surface area of the boundary surface.

Note that the benefits of alternately arranged small conductive and insulating regions are that the surface comprises numerous areas where the work function is low and which are close to other areas where the electric field is intensified. Since it is especially the combination between the locally intensified electric field and the locations on the surface having a low work function, one may appreciate that a surface according to this embodiment is very efficient in releasing electrons in the discharge space.

Note that according to a preferred embodiment of the present invention, the insulating regions are comprised of a dielectric material. Dielectric materials having electrically insulating properties are suitable for use in combination with the present invention.

It will be understood that in a dielectric barrier discharge configuration (DBD) as above, the teachings of the invention may easily be achieved by adding regions of conductive material to the surface of the electrodes comprising the dielectric layer. Note that this may be achieved by sputtering, vapour deposition, etching, coating or any other method of fixing, adhering or incorporating electrically conductive regions at or onto the surface. In particular, the conducting and insulating regions may be formed by sputtering of a metal coating on a dielectric layer in plasma, followed by exposure to air.

Note that the embodiments described above, are not limited to electrodes covered with a dielectric layer. Any configuration wherein the boundary surface of the electrodes with the discharge space is comprised of one or more alternately arranged conductive and insulating regions, and wherein the insulating regions are comprised of a dielectric material, fall within the scope of the embodiments described. This may also include a bare conducting electrode onto which a dielectric material may be sputtered, etched, coated, deposited using vapour deposition, etc.

Another benefit of this latter embodiment is that is has been observed that the effects of the teachings of the present invention, in combination with a dielectric barrier configuration as described, are well suited for providing a uniform plasma. These embodiments may be used, for instance, in order to generate plasmas at atmospheric pressure at low temperatures, using for example air.

The dielectric material may be selected from a group comprising polyethyleneterephthalate (PET), polyethylenenaphthalate (PEN), polytetrafluoroethylene (PTFE), triacetate cellulose (TAC), polyolefins such as polyethylene and polypropylene, polyamides, polyurethans, polystyrenes, polycabonates, polysiloxanes, polyacrylates, polymethacrylates, ceramics such as $SiO_2$, $Al_2O_3$, ZrO, Y2O3, CaCO3 or MgO and combinations thereof. It will be understood that any other dielectric material may be used however, adequate results have been obtained using the above-mentioned dielectric materials.

According to another preferred embodiment of the invention, the one or more conductive regions are comprised of a metal. This metal may be selected from a group comprising nickel (Ni), chrome (Cr), copper (Cu), iron (Fe), gold (Au), molybdenum (Mb), silver (Ag), aluminum (Al), titanium (Ti), Cobalt (Co), Magnesium (Mg), Platinum (Pt), Tin (St), Zinc (Zn) and the like. Of course any other suitable metal may be used as well. Adequate results and stable and uniform plasmas have been obtained using the above-mentioned metals.

In a specific embodiment of the present invention the conductive regions are formed by a metal layer, a surface of which forming the boundary surface. According to this embodiment the electrode is covered with a metal layer on which, for instance, a plurality of insulating regions may be deposited. As will be appreciated, one may also think of an electrode covered with a dielectric layer (according to one of the embodiments above), which dielectric layer is covered with a metal layer wherein by means of etching the dielectric surface is uncovered forming the plurality of electrically conductive and insulating regions.

According to another embodiment of the present invention, the electrode is substantially formed by the metal layer mentioned above. In this case, one may think of a bare electrode, not covered with a dielectric layer, the bare electrode comprising a boundary layer with the discharge space, upon which a plurality of insulating regions, such as closed insulating areas, have been formed, for instance by depositing an insulating material.

In a yet further embodiment of the invention, the electrode is covered by dielectric material on which a plurality of electrically conductive regions are deposited, for example having the form of closed patches.

Note that these conductive regions or insulating regions may be embedded in the boundary surface, for instance as closed conductive patches embedded in a dielectric surface in a DBD configuration or closed insulating areas in a metal layer.

According to another embodiment of the present invention, the conductive or insulating regions may be arranged to form a conducting or insulating periodic structure. The periodic structure may be selected from group including grids, concentric circles, wires, line patterns, strips and any other similar structures.

The electrically conductive regions and insulating regions may be selected from a group comprising squares, circles, spots, triangles, polygons and other shapes.

Any of these periodic structures, patches and regions may easily be uniformly arranged on the surface (such as a checkerboard pattern for instance) and are therefor suitable for use with the invention.

In another embodiment of the present invention, a mixture of a metal and of a polymer is used to produce a surface with a very low work function. In this manner the field emission and the secondary electron emission are strongly intensified, which supports the generation of a uniform plasma. The amount of metal must be dominant.

According to a second aspect, the invention provides an electrode for use in an arrangement according to any of the embodiments described above, said electrode comprising a surface for use as a boundary surface with a discharge space of said arrangement, wherein said surface is comprised of one or more alternately arranged conductive and insulating regions.

In accordance with a third aspect, the invention also relates to a method for generating and sustaining a glow discharge plasma in a plasma discharge space comprising at least a pair of electrodes, by introducing a gas or gas mixture under atmospheric pressure conditions in said discharge space, by energizing said electrodes using AC power supply means providing an electric field for generating a plasma in said electric field, wherein at least one of said electrodes having a boundary surface with said discharge space and said boundary surface is comprised of one or more alternately arranged conductive and insulating regions, as disclosed above.

In accordance with a fourth aspect, the present invention relates to a method for treating a surface of a body, such as a substrate surface of a photo film, by exposing the surface to a plasma generated by the arrangement of the invention as disclosed above.

The teachings of this invention may be applied in material processing and/or surface treatment processes in numerous industries. They may be used for all kinds of surface treatments, amongst which are cleaning and activation of surfaces, deposition such as plasma enhanced chemical vapour deposition (PECVD), etc. The teachings of this invention are also suitable to be used for improving the adhesive properties of a surface, such as polymer surfaces which is applied in the photo film production industry.

The above-mentioned and other features and advantages of the invention are illustrated in the following description of the present invention, with reference to the enclosed drawings. The embodiments described are directed to the treatment of a surface of body with an atmospheric pressure glow plasma (APG). However the invention is not limited to the embodiments disclosed, which are only provided for explanatory purposes.

DETAILED DESCRIPTION OF THE DRAWINGS

Figure 1:
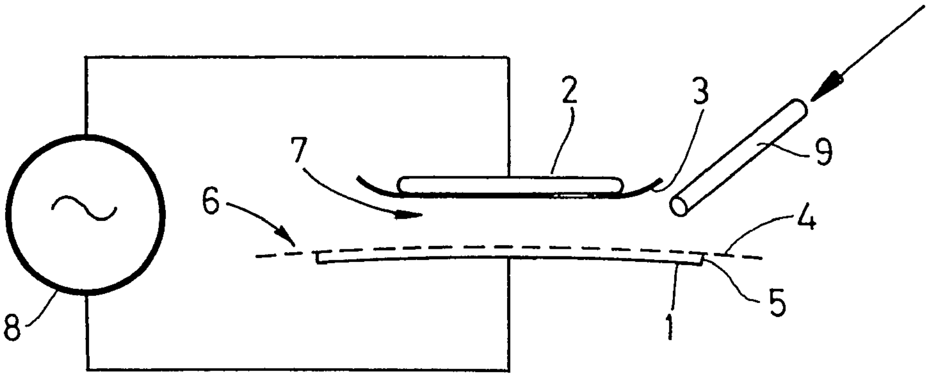
FIG. 1 is a schematic drawing of an arrangement according to the present invention.

FIG. 1 is a schematic drawing of an arrangement according to the present invention. The arrangement comprises a first electrode 1 and a second electrode 2. A surface to be treated 3, for instance a polymer film, is transported across the surface of the second electrode 2. The first electrode is comprised of a conductive layer 1 upon which a dielectric material layer 5 is attached. The surface 6 of the dielectric material 5 facing the discharge space 7 forms a boundary surface with the discharge space 7. A plurality of conductive regions 4 have been embedded in the surface 6 of the dielectric layer 5, such that the boundary surface is comprised of a plurality of insulating and conductive regions. The electrodes 1 and 2 are connected to a power supply 8 for providing an electric field in the discharge space 7. For the purpose of generating a plasma in the discharge space, gas supply means 9 have been provided for supplying a gas or a gas mixture under atmospheric pressure in the discharge space 7.

Gasses for generating the plasma can be selected from a group comprising Helium, Argon, Nitrogen, Air, Oxygen, Carbon Dioxide, and a mixture comprising any of the gasses of the group.

Figure 2:
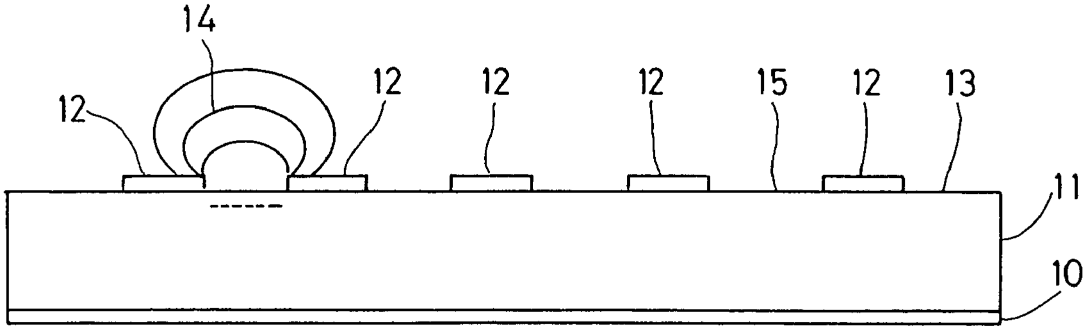
FIG. 2 schematically shows a boundary surface between an electrode and a discharge space in an arrangement according to the present invention.

FIG. 2 shows an enlargement of an electrode that may be used in an arrangement according to the present invention. The electrode may be comprised of a conductive layer 10 that may be connected to a power supply (not shown). The electrode is covered with a dielectric layer 11, which is on one side adjacent to the conductive layer 10 and on the other side provide a boundary surface 13, which boundary surface 13 is facing the discharge space. A plurality of electrically conductive patches 12 is present on the boundary surface 13 of the dielectric layer 11.

The conductive patches 12 may be comprised of a metal or any other electrically conductive material. As will be appreciated by a person skilled in the art, the conductive patches reveal a surface to the discharge space which has a low work function, this means that electrons present near the surface of the patches 12 may easily be released in the discharge space since the energy required in order to release these electrons from the conductor into the discharge space is relatively small. The regions 15 in between the patches 12, which regions form the insulating regions of the boundary surface, are characterised by charge accumulation of charge near the surface of the insulator under the influence of an electric field present in the discharge space above the boundary surface 13. Due to this charge accumulation the electric field is locally intensified by the dense charge at the surface. The lines 14 are lines where the electric potential of the electric field is constant. The electric field lines (not shown) are perpendicular to the lines 14. The lines 14 therefor show the intensification of the electric field for explanatory purposes only.

Note that the combination of the patches 12, having a low work function, and the intensified electric field (as depicted by the lines 14) provides benefits, since the surface 13 is able to efficiently release electrons through the patches 12 while the areas 15 intensify the electric field and thereby stimulate the electrons at the patches 12 to enter the discharge space. In fact due to the intensified electric field, the potential barrier between the conductive regions 12 and the discharge space is lowered. A surface according to the present invention is therefor much more efficient in releasing electrons, than a surface comprising a conductive material only or a surface comprising an insulating material only. It is due to the combination of the properties of conductors and insulators that the effects of the present invention are achieved.

Preferably the conductive properties of the dielectric may be chosen such that loss of charge caused by leakage thereof is eliminated or brought down to an absolute minimum, as this may add to instability of the plasma. Good results have been achieved with using dielectric materials having a conductivity which is equal to or smaller than $10^{-10}\ \Omega^{-1}cm^{-1}$, especially dielectric material having a conductivity smaller than $10^{-12}\ \Omega^{-1}\ cm^{-1}$, for forming the insulative regions.

The size of the structures, patches and region at the boundary surface are preferably chosen such that sufficient charge will be present to generate a plasma. Good results have been achieved using structures, patches and region having dimensions in the range of 1 nm and 1 mm. It is noted that regions of this dimension do not give rise to practical difficulties during the fabrication process.

The invention is, however, not limited to the use of dielectric materials having these properties and/or the dimensions of the structures, patches and regions as mentioned above; the ranges given should be considered as indicative.

Figure 3:
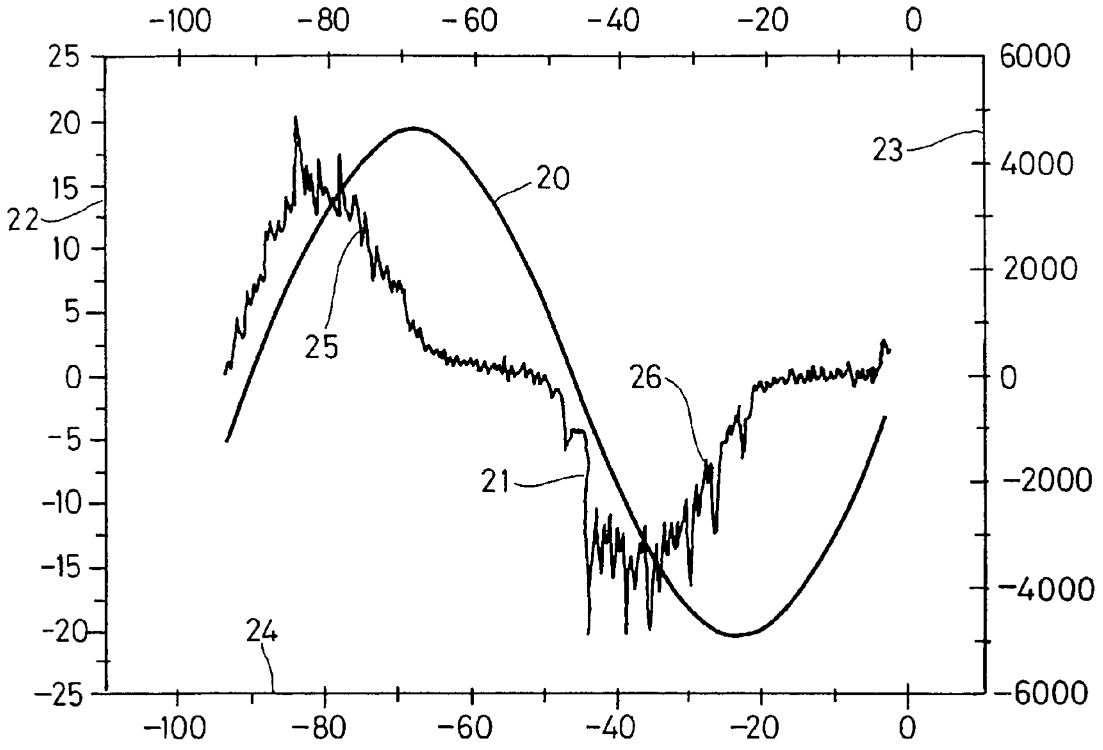
FIG. 3 provides a plasma current-voltage diagram of a plasma generated with an arrangement according to the present invention.

FIG. 3 shows a plasma current-voltage diagram of a experiment conducted with an electrode according to the present invention. The vertical axis on the left 22 shows the plasma current in mA. The vertical axis on the right 23 shows the voltage applied to the electrodes in V. On the horizontal access 24 the time in μs is shown. The sine curve 20 is the voltage applied to the electrodes and curve 21 is the plasma current.

The experiment was conducted using a similar arrangement as shown in FIG. 1. One of the electrodes within the arrangement was covered with a dielectric layer of PET with a thickness of approximately 200 μm. The dielectric layer was then coated with a layer of NiCr with a thickness of approximately 100 nm, using physical vapour deposition. The electrode was placed in the arrangement such that the NiCr-layer was facing the discharge space. The other electrode in the arrangement was covered with the dielectric layer of PEN, with a thickness of approximately 100 μm.

The dielectric barrier discharge configuration formed by the above-mentioned arrangement, was first used in a pre-treatment process that was necessary in order to create a plurality of cracks in the NiCr-layer. The plurality of cracks in het NiCr-layer were necessary in order to uncover the underlying dielectric layer of PET. Therefor after pre-treatment of the electrode covered with a layer of PET and a layer of NiCr, the electrode provided a boundary surface with the discharge space, which boundary surface was comprised of alternating conductive and insulating regions, in accordance with the present invention.

The plasma corresponding to the plasma current diagram of FIG. 3, was generated using a gap distance between the electrodes of 1.7 mm while the applied voltage had an amplitude of approximately 4.5 kV. The discharge space was filled with air at an atmospheric pressure at room temperature (approximately 300 K). It has been observed that the breakdown voltage decreased remarkably in air till a value of half of the starting value.

The peaks 25 and 26 of the plasma current curve 21 are relatively smooth as compared to plasma current peaks that would be achieved in case of streamer formation (not shown). Plasma current curve of a streamer formation often reveals many strong peaks of short duration. As can be seen in FIG. 3 the plasma current curve 21 shown in FIG. 3 consists of peaks 25 and 26 which have relatively long duration (in the same order of the duration of a halve period of the applied voltage) and comprise a plurality of noise peaks superimposed on the main peaks 25, 26.

Figure 5:
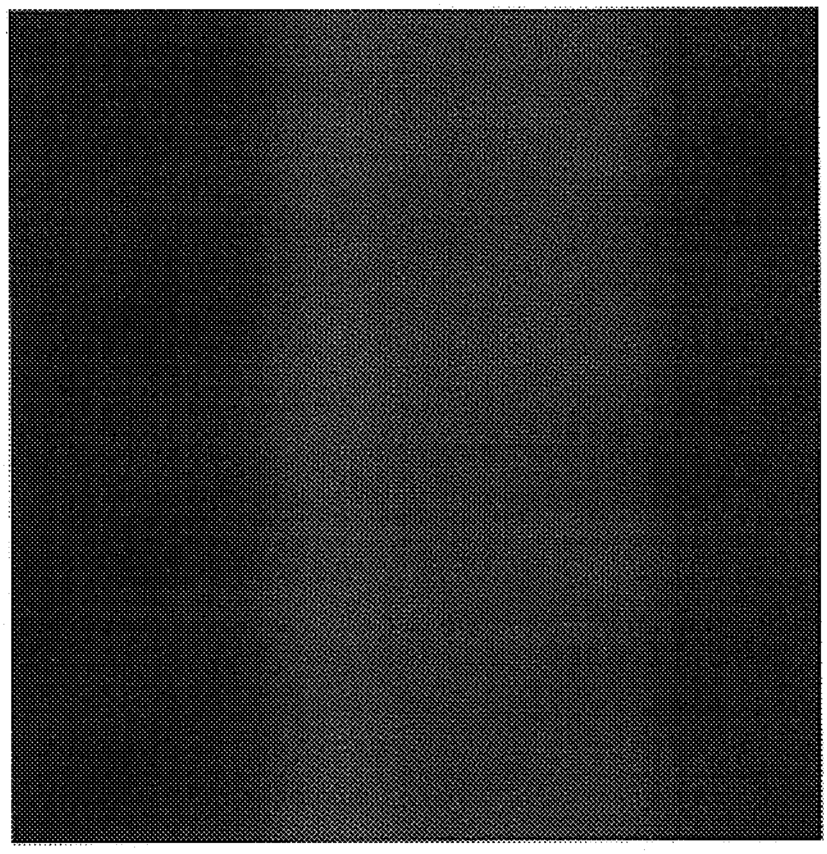
FIG. 5 shows an observation of plasma behavior using a fast camera.

FIG. 5 shows the results of observations of the plasma behaviour with a fast camera. The fast camera takes a number of sample line scans during a plasma discharge, and puts these sample line scans together sequentially in the vertical direction, starting at the top, to form an image as shown in FIG. 5. Therefore, the vertical direction corresponds to the duration of the measurement, wherein in the present case, a scan was taken each 15 μs. The light scans are achieved by integrating the light present in the discharge space, parallel to the electric field. The discharge space was filled with air, and the plasma was generated using a cathode covered with a hybrid layer of NiCr and PEN, according to the present invention. The gap distance between the electrodes forming the discharge space was 1.7 mm and the frequency of the AC voltage applied to the electrodes was 11.8 kHz. The observations indicate a diffuse glow discharge in the entire electrode gap. This is also confirmed by the light emitted and detected with a fast photo multiplier tube (PMT).

Figure 4A:
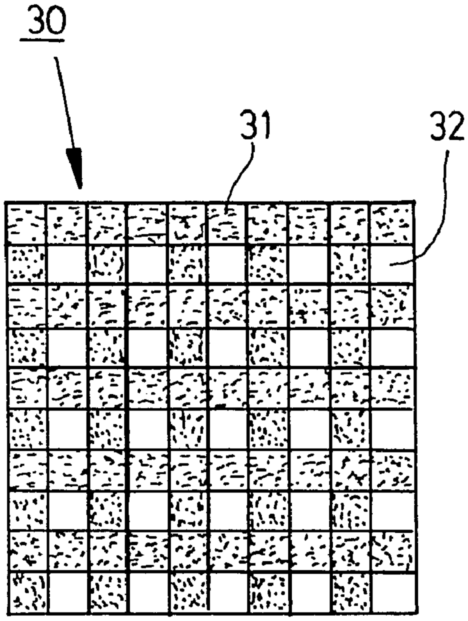
FIGS. 4*a*-*d* show a number of surfaces comprising conductive and insulating regions.

FIG. 4*a-d* shows a number of possible surface configuration comprising a plurality of conductive and insulating regions which are alternately arranged. FIG. 4*a* shows a surface 30 which is comprised of an insulating surface 32, this may for instance be a dielectric such as PEN or PET, on top of which a conductive grid 31 has been placed together forming the boundary surface 30. Note that by using the conductive grid 31 in combination with the insulating layer 32, a homogeneous distribution of square shaped insulating areas is revealed to the discharge space. Note further that the boundary surface 30 may also be constructed of a conductive layer, on top of which an insulating grid is placed.

Figure 4B:
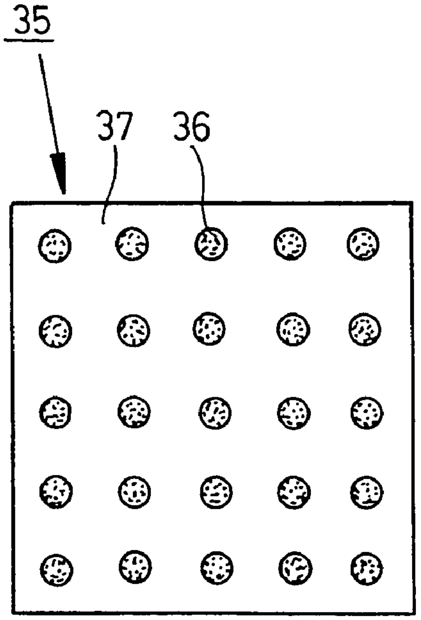
Figure 4C:
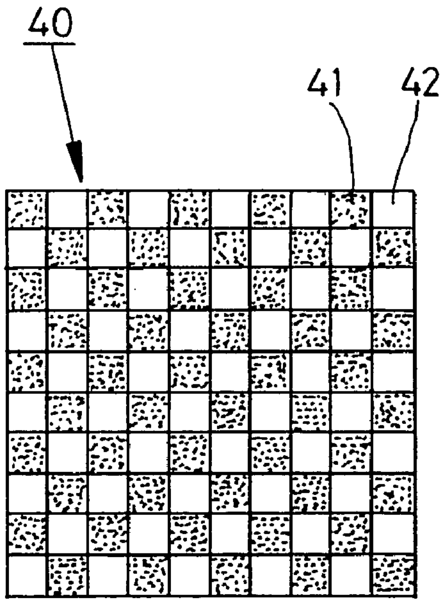

FIG. 4*b* shows another configuration of the boundary layer 35, wherein a plurality of conductive disk shaped patches is homogeneously distributed over an insulating surface 37. In FIG. 4*c*, the boundary surface 40 is comprised of a checkerboard configuration of square-formed conductive patches 41 and insulating areas 42. Note that this configuration provides a homogeneously distributed even amount of conductive and insulating regions which are alternately arranged wherein the total surface of the conductive regions equals the total surface of the insulating regions.

Figure 4D:
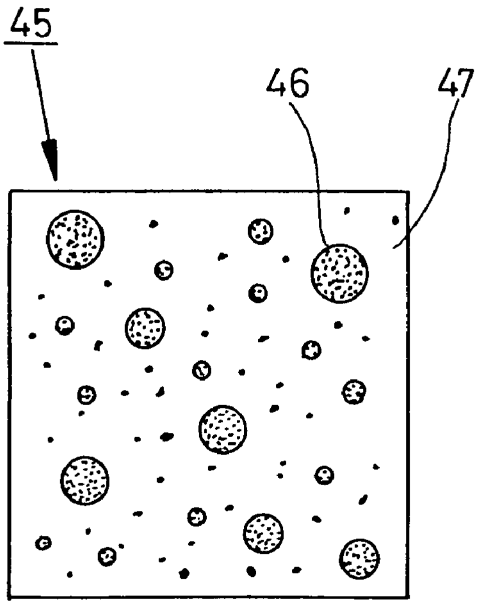

FIG. 4*d* shows a configuration wherein a plurality of bigger and smaller conductive regions 46 are arranged on a insulating surface 47 for forming the boundary surface 45. Boundary surface 45 may for instance easily be constructed by spraying or sputtering a conductive coating onto the insulating surface, and therefor provides an efficient way of manufacturing such a boundary surface.

It will be appreciated that numerous modifications and variations of the present invention are possible in the light of the above teachings. It is therefor understood that within the scope of the attached claims, the invention may be practised otherwise than as specifically described herein.

The invention claimed is:

1. An arrangement for generating a plasma, comprising a discharge space between at least a pair of electrodes arranged for providing an electric field and for generating a plasma in said electric field, at least one of said electrodes having a layered structure including a conductive layer directly connected to a power supply and covered by a dielectric layer, said dielectric layer having a boundary surface with said discharge space, wherein said boundary surface is comprised of a plurality of alternately arranged non-electrode conductive and insulating regions, said non-electrode conductive regions being indirectly coupled to the conductive layer and being present on the boundary surface of the dielectric layer.

2. The arrangement according to claim 1, wherein said non-electrode conductive regions and said insulating regions are uniformly distributed across said boundary surface.

3. The arrangement according to claim 1, wherein said non-electrode conductive regions, said insulating regions and said boundary surface have surface areas, and wherein the surface area of either one or more of said non-electrode conductive regions and said insulating regions is at least an order of a magnitude less than the surface area of said boundary surface.

4. The arrangement according to claim 1, wherein said insulating regions are comprised of a dielectric material.

5. The arrangement according to claim 4, wherein said dielectric material has a conductivity smaller than or equal to $10^{-10}\Omega^{-1}\ cm^{-1}$.

6. The arrangement according to claim 5, wherein said dielectric material has a conductivity smaller than or equal to $10^{-12}\Omega^{-1}\ cm^{-1}$.

7. The arrangement according to claim 4, wherein said insulating regions are formed by a dielectric layer, a surface of which forming said boundary surface.

8. The arrangement according to claim 7, wherein said non-electrode conductive regions are exposed passive conductive regions embedded in said surface of said dielectric layer.

9. Arrangement according to claim 8, wherein said non-electrode conducting and insulating regions have been formed by sputtering of a metal coating on a dielectric layer in plasma followed by exposure to air.

10. The arrangement according to claim 7, wherein said dielectric layer is a current limiting dielectric layer present on at least one of said electrodes.

11. The arrangement according to claim 4, wherein said dielectric material is selected from a group comprising polyethyleneterephthalate(PET), polyethylenenaphthalate (PEN), polytetrafluoroethylene (PTFE), triacetate cellulose (TAC), polyolefins such as polyethylene and polypropylene, polyamides, polyurethans, polystyrenes, polycabonates, polysiloxanes, polyacrylates, polymethacrylates, ceramics such as $SiO_2$, $A1_2O_3$, ZrO, Y2O3, CaCO3 or MgO and combinations thereof.

12. The arrangement according to claim 1, wherein said plurality of non-electrode conductive regions are comprised of a metal.

13. The arrangement according to claim 12, wherein said non-electrode conductive regions are formed by a metal layer, a surface of said metal layer forming said boundary surface.

14. The arrangement according to claim 13, wherein the plurality of electrically conductive and insulating regions are formed by ay least one of a group comprising a plurality of insulting regions deposited on said metal layer,or uncovering said dielectric layer by means of etching said metal layer.

15. The arrangement according to claims 12, wherein said metal is selected from a group comprising nickel (Ni), chrome (Cr), copper (Cu), iron (Fe), gold (Au), molybdenum (Mb), silver (Ag), aluminum (Al), titanium (Ti), Cobalt (Co), Magnesium (Mg), Platinum (Pt), Tin (St), Zinc (Zn) or combinations thereof.

16. The arrangement according to claim 1, wherein said non-electrode conducting or insulating regions are comprised by a conductive or insulating powder, respectively.

17. The arrangement according to claim 1, wherein said non-electrode conductive regions are comprised by one or more closed conductive patches.

18. The arrangement according to claim 17, wherein either one or more of said patches and areas is selected from a group comprising squares, circles, spots, triangles, polygons and other shapes.

19. The arrangement according to claim 1, wherein said insulating regions are comprised by one or more closed insulating areas.

20. The arrangement according to claim 19, wherein either one or more of said areas is selected from a group comprising squares, circles, spots, triangles, polygons and other shapes.

21. The arrangement according to claim 1, wherein either one of said conductive or insulating regions are arranged to form a conducting or insulating periodic structure.

22. The arrangement according to claim 21, wherein said periodic structure is selected from a group comprising grids, concentric circles, wires, line patterns, strips, a checkerboard configuration of non-electrodes conducting and insulating regions,and similar structures.

23. An electrode for use in an arrangement for generating a plasma in a discharge space as one of at least a pair of electrodes arranged for providing an electric field and for generating a plasma there between in the electric field, said electrode comprising a conductive electrode layer directly connected to a power supply, a dielectric layer covering an upper surface of the conductive layer, an upper surface of the dielectric layer forming a boundary surface with a discharge space of said arrangement, wherein said boundary surface is comprised of one or more alternately arranged non-electrode conductive and insulating regions with said non-electrode conductive regions being indirectly coupled to the conductive layer.

* * * * *